(12) United States Patent
Yoon

(10) Patent No.: US 7,014,499 B2
(45) Date of Patent: Mar. 21, 2006

(54) PROBE CARD FOR TESTING SEMICONDUCTOR DEVICE

(75) Inventor: Soo Yoon, Seoul (KR)

(73) Assignee: Yulim Hitech, Inc., (KR)

(*) Notice: Subject to any disclaimer, the term of this patent is extended or adjusted under 35 U.S.C. 154(b) by 0 days.

(21) Appl. No.: 11/057,986

(22) Filed: Feb. 15, 2005

(65) Prior Publication Data

US 2006/0003625 A1 Jan. 5, 2006

(30) Foreign Application Priority Data

Jul. 5, 2004 (KR) .................. 10-2004-0051988
Oct. 14, 2004 (KR) .................. 10-2004-0082020

(51) Int. Cl.
*H01R 11/18* (2006.01)

(52) U.S. Cl. .................. 439/482; 324/754
(58) Field of Classification Search ........... 439/482; 324/754, 765, 761, 762
See application file for complete search history.

(56) References Cited

U.S. PATENT DOCUMENTS

| | | | | |
|---|---|---|---|---|
| 5,068,601 A | * | 11/1991 | Parmenter | 324/754 |
| 5,656,943 A | * | 8/1997 | Montoya et al. | 324/754 |
| 6,566,898 B1 | * | 5/2003 | Theissen et al. | 324/754 |
| 6,853,205 B1 | * | 2/2005 | Cheng et al. | 324/754 |
| 2002/0109514 A1 | * | 8/2002 | Brandorff et al. | 324/754 |
| 2005/0140381 A1 | * | 6/2005 | Sporck et al. | 324/754 |

* cited by examiner

*Primary Examiner*—Phuong Dinh
(74) *Attorney, Agent, or Firm*—Dilworth & Barrese LLP

(57) ABSTRACT

A probe card for testing semiconductor devices includes a main board member, an upper reinforcing plate, a lower reinforcing plate, an interface member, a sub board member, a needle guide member, a needle member, a side cover member, and a clamping member. The probe card achieves an interface between the circuit boards through elastic connection pins so as to cope with a connection shock with the connection terminals of a semiconductor device, thereby preventing damages on the boards, and has the component parts combined together simply by face contacts to facilitate assembly and disassembly of the component parts and thereby to provide a great economical advantage in the aspect of maintenance and repair.

14 Claims, 6 Drawing Sheets

US 7,014,499 B2

PROBE CARD FOR TESTING SEMICONDUCTOR DEVICE

PRIORITY

This application claims priority to an application entitled "Probe Card for Testing Semiconductor" filed in the Korean Industrial Property Office on Jul. 5, 2004 and assigned Serial No. 2004-51988, and to an application entitled "Probe Card for Testing Semiconductor" filed in the Korean Industrial Property Office on Oct. 14, 2004 and assigned Serial No. 2004-82020, the contents of both of which are incorporated herein by reference.

BACKGROUND OF THE INVENTION

1. The Field of the Invention

This invention relates to a probe card for testing semiconductor devices. More particularly, this invention relates to a probe card for testing semiconductor devices that has a simplified circuit configuration for internal transmission of electrical signals and enhances its fabrication and assembly characteristics to guarantee improved reliability to productivity and performance.

2. Description of the Related Art

Generally, the process for manufacturing a semiconductor device includes a fabrication process for forming patterns on a wafer and an assembly process for assembling the pattern-formed wafer into chips, and additionally an electrical die sorting (hereinafter referred to as "EDS") process provided between the fabrication and assembly processes to test the electrical characteristics of the individual chips constituting the wafer.

The EDS process is discriminating defectives among the component chips of the wafer, i.e., applying electrical signals to the component chips of the wafer and determining the defectiveness of the chips from the feedback signals checked. The facility provided for this EDS process is called "probe equipment".

In the probe equipment, a configuration for applying electrical signals in direct contact with the pattern of each chip on the wafer is called "probe card".

The testing for electrical characteristics of a semiconductor wafer using the probe card is measuring the electrical characteristics of the semiconductor wafer by making the needles of the probe card in contact with the electrode pad of each device and applying a specific current through the needles.

When the testing result for a semiconductor device using the probe card is found out "good", the semiconductor device is fabricated into a complete product by the subsequent process such as packaging.

In accordance with the recent trends towards high integration and extreme miniaturization of semiconductor devices and size increase of wafers for the purpose of improved productivity, there is a demand for testing equipment appropriately copying with such trends of technology for the testing of the semiconductor devices.

In other words, the most important real problem in the technological development of the probe card is appropriately coping with the testing of semiconductor devices that are fabricated in a larger number with its miniaturization from a larger wafer, and testing a larger number of semiconductor devices in a simultaneous manner.

The probe cards include a main board, a sub board, a means for interfacing the sub board, and needles for transmission of electrical signals from the sub board to the semiconductor device.

Namely, the configurations of the interface means, the sub board, the needles, and the needle guide are improved so as to reduce circuit patterns from the main board to the sub board with more enhanced electrical characteristics.

According to the aforementioned patents of the applicant of the present invention, the configuration of the interface means between the main board and the sub board is more simplified to achieve an accurate transmission of electrical signals from the main board to the sub board, and the needles are changed from a wire type to a fine blade type so as to appropriately cope with high-density and high-integration semiconductor device patterns.

In particular, a number of micro needles are formed simultaneously by a fine-pattern forming process for the fabrication of semiconductor devices, such as an etching process, thereby facilitating the testing of the electrical characteristics of the semiconductor devices having a fine pattern.

However, the conventional interface means for transmission of electrical signals between the main board and the sub board has no or little connection flexibility.

Namely, the interfacing means between the main board and the sub board is mostly formed in the bar or wire form having a cross section shaped like a circle or a circle-like ellipsoid. The top and bottom ends of the interfacing means are associated with the main board and the sub board, respectively, by welding or soldering for transmission of electrical signals.

Such an interface means has no flexibility at all, so a vertical impact due to the contact with the connection terminals of the semiconductor device in use may cause damages on the welded or soldered part of the circuit board, particularly damaging the main board that is a relatively expensive component part.

Once the main board, the interface means, and the sub board are combined together firmed by welding or soldering, they cannot be separated from one another, causing an uneconomical problem in regard to the difficulty of repair.

The flatness of the sub board is of a great importance in achieving a stable connection, but there is no configuration for guaranteeing the flatness. It is therefore possible to check a normal connection state only through a testing for checking the power output from the respective connection terminals by applying the power to the main board in the complete assembly. With a defective detected in the testing in the assembly situation, there is no way but do away with the probe card due to the difficulty of disassembly and repair, causing a great economic loss.

SUMMARY OF THE INVENTION

It is therefore an object of the present invention to provide a probe card for testing a semiconductor devices that has flexibility in a wide range for an elastic connection between a main board and a sub board and provides an improved assembly characteristic to enhance a stable high-frequency signal transmission efficiency and guarantee a readiness of fabrication.

It is another object of the present invention to provide a probe card for testing a semiconductor devices that achieves a terminal connection between the boards through elastic connection pins to achieve a stable connection and a reduced contact shock and thereby provide a strong connection structure.

It is still another object of the present invention to provide an improved needle tip having a firm and constant connection area and thereby to guarantee a more stable connection.

To achieve the objects of the present invention, there is provided a probe card for testing a semiconductor devices that includes: a main board member, an upper reinforcing plate, a lower reinforcing plate, an interface member, a sub board member, a needle guide member, a needle member, a side cover member, and a clamping member. The main board member has connection terminals formed on a top side thereof to be in contact with pogo pins of a test head, and connection terminals concentrated on the center of a bottom side thereof to be in contact with the connection terminals of the top side, thereby forming a connection circuit. The upper reinforcing plate is fixedly engaged with the center of the top side of the main board member so as to prevent an upward distortion of the main board member. The lower reinforcing plate is formed in a track-shaped structure having a predetermined thickness and a predetermined width on the center of the main board member, and fixedly engaged with the main board member together with the upper reinforcing plate so as to prevent a downward distortion of the main board member. The interface member has connection terminals formed on the top and bottom sides thereof on a same vertical line to be in contact with each other. Each connection terminal is combined with the one end of a connection pin at a predetermined angle in the mutually corresponding directions to have elasticity. The other end of the connection pin on the top side is in contact with the connection circuit of the main board member. The interface member is inserted in an inner space of the lower reinforcing plate so as to prevent its horizontal movement. The sub board member is formed from a ceramic material and has a circuit pattern formed by a fine-pattern forming process of semiconductor. The circuit pattern has connection terminals formed on a top side thereof to be in contact with the connection pins slantly extending downward from the interface member, and connection terminals formed on a bottom side thereof to form an integrated circuit pattern smaller in size than the circuit pattern of the top side. The needle guide member has a flat plate provided with a plurality of needle insert holes formed on the same vertical line of the connection terminals on the bottom side of the sub board, and is attached to the bottom side of the sub board member. The needle member has a patterned fine thin plate inserted into the respective needle insert holes of the needle guide member. The side cover member is inserted into the lower reinforcing plate and has a stepped inner neck with the sub board member and the needle guide member combined together and fixedly inserted therein. The clamping member has the one end thereof being bolted to the lower reinforcing plate and the other end thereof being formed from a thin plate of an elastic metal material so as to press down a stepped outer neck of the side cover member.

DETAILED DESCRIPTION OF THE INVENTION

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. To clarify the present invention, parts not described in the specification are omitted.

Figure 1:
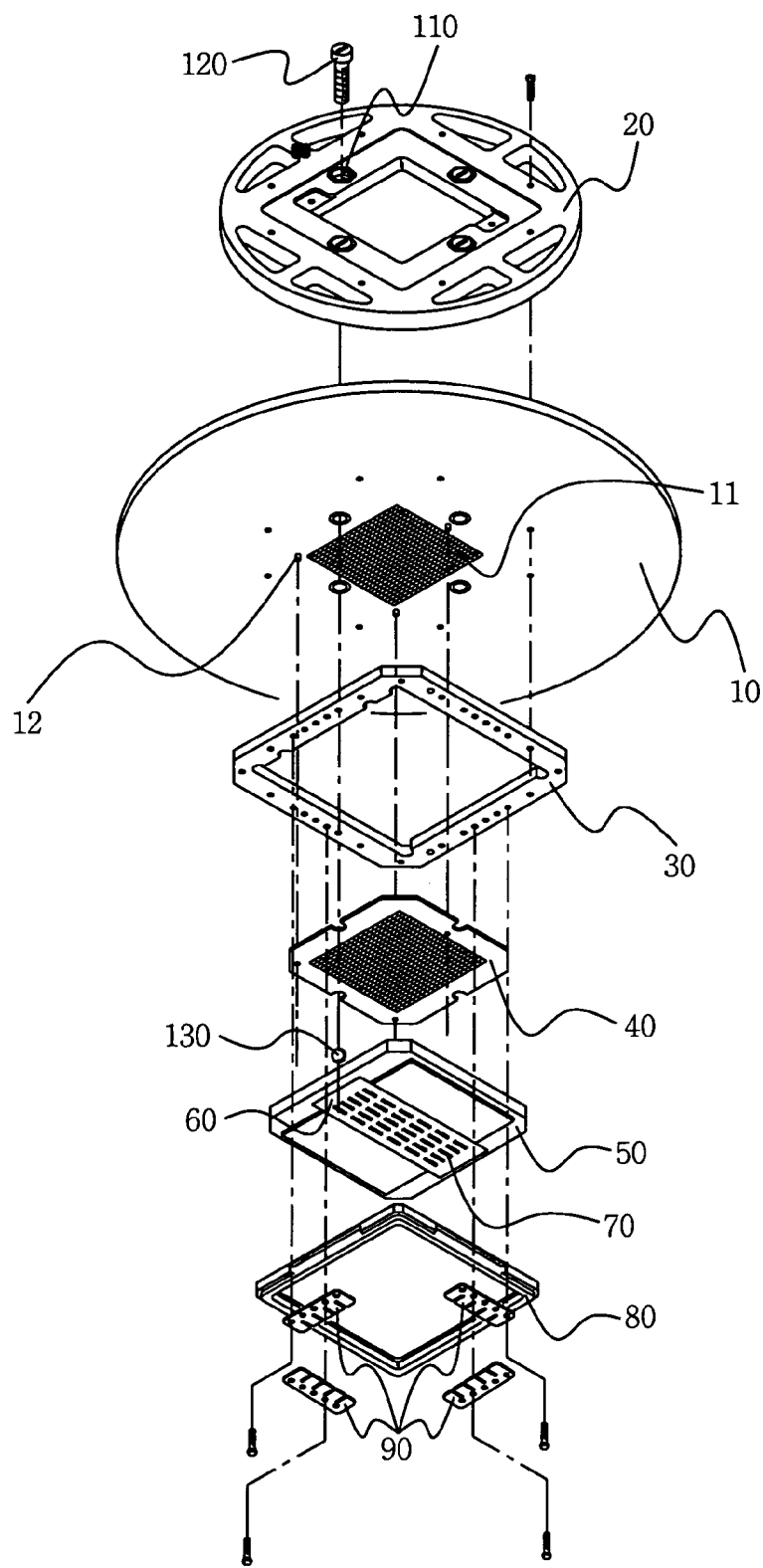
FIG. 1 is an exploded perspective view of a probe card according to the present invention.
Figure 2:
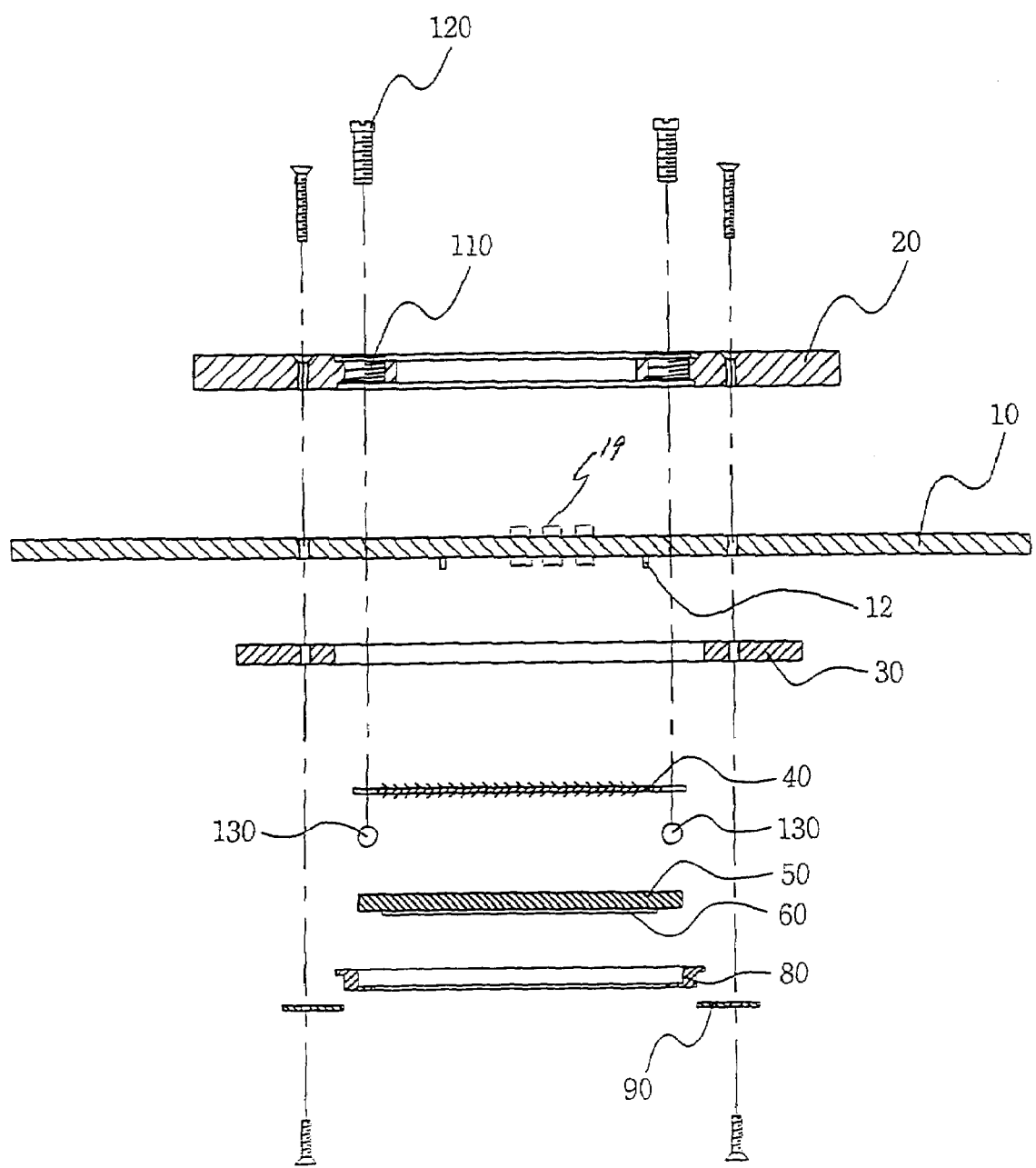
FIG. 2 is an exploded cross-sectional view of the probe card according to the present invention.

FIG. 1 is a perspective view of a disassembled probe card for testing semiconductors according to the present invention, and FIG. 2 is an exploded cross-section of the probe card of the present invention.

The probe card of the present invention comprises, as shown in FIGS. 1 and 2, a main board member 10, an upper reinforcing plate 20, a lower reinforcing plate 30, an interface member 40, a sub board member 50, a needle guide member 60, a needle member 70, a side cover member 80, and a clamping member 90.

The main board member 10 is a disk-shaped circuit board that has connection terminals 19 formed in the circumference of the top side of the main board member 10 to be in contact with the pogo pins of a test head, and a connection circuit with connection terminals 19 centered on the bottom side of the main board member 10 to be in contact with the connection terminals 19 of the top side.

The upper reinforcing plate 20 is an upper reinforcing means provided on the top side of the main board member 10 so as to prevent an upward distortion of the main board member 10, such as bending and warping.

The lower reinforcing plate 30 is provided on the bottom side of the main board member 10 in correspondence to the upper reinforcing plate 20 and securely bolted to the main board member 10 with the upper reinforcing plate 20.

Being opposite to the upper reinforcing plate 20, the lower reinforcing plate 30 is a lower reinforcing means provided to prevent a downward distortion of the main board member 10, such as bending and warping. The lower reinforcing plate 30 has a track-shaped structure having a predetermined width and a predetermined thickness with an opening having a predetermined area and forming a through contact with the bottom center of the main board member 10 so as to expose the connection circuit 11 formed on the bottom side of the main board member 10.

Most preferably, the upper reinforcing plate 20 and the lower reinforcing plate 30 are formed from a SUS material highly resistant to shock and distortion so as to reinforce the main board member 10.

Figure 3:
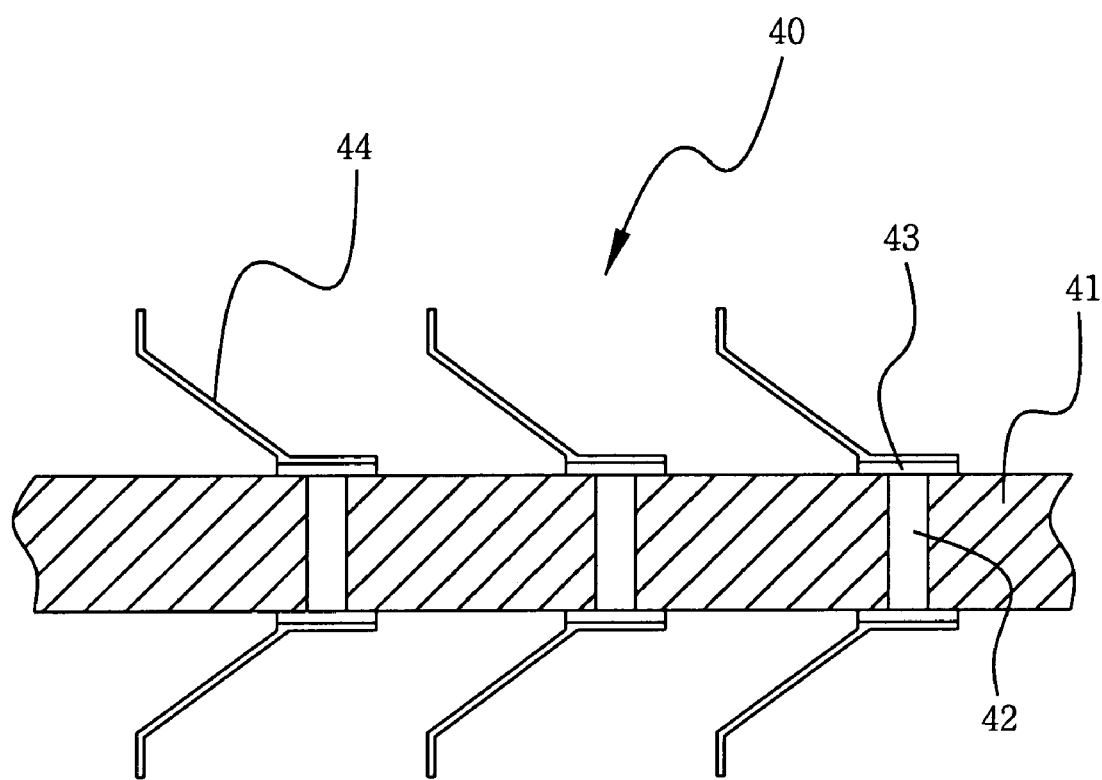
FIG. 3 is a partial cross-sectional view showing the principal structure of an interface member of the present invention.

The interface member 40 is a connection means for connecting electrical signals from the main board member 10. The interface member 40 includes, as shown in FIG. 3, a thin board 41 having vertical contact holes each filled with a conductor 42. Connection terminals 43 are formed on the top and bottom parts of the conductor 42. Each connection terminal 43 is associated with connection pins 44 by soldering, or the like. The one end of each connection pin 44 is fixed to the connection terminal 43 at a predetermined angle to have elasticity, and the other end of it slantly extends downward or upward with a predetermined height.

The interface member 40 has insert holes formed at defined positions in its outer circumference, and the main board member 10 has guide projections 12 extending downward from the connection circuit 11 on the bottom side with a predetermined height. The guide projections 12 of the main board member 10 are engaged into the insert holes of the interface member 40, so the interface member 40 cannot move in the horizontal direction.

The interface member 40 has a board 41 being a non-conductor formed from the same material of the main board member 10. The connection pins 44 provided on the top and bottom parts of the interface member 40 are formed from a highly conductive material.

The sub board member 50 is a circuit board that includes the circuit patterns of the main board member 10 formed more densely with high integration and high density. The sub board member 50 has connection terminals formed on its top side and connected with the interface member 40 through the connection pins 44 elastically formed on the bottom side of the interface member 40.

In accordance with the present invention, the sub board member 50 is formed from a ceramic material having a high heat resistance. Likewise a silicon board, the sub board member 50 has a circuit pattern formed by a method of forming a fine pattern of semiconductor.

More preferably, the sub board member 50 has the same outer diameter of the interface member 40.

Figure 4:
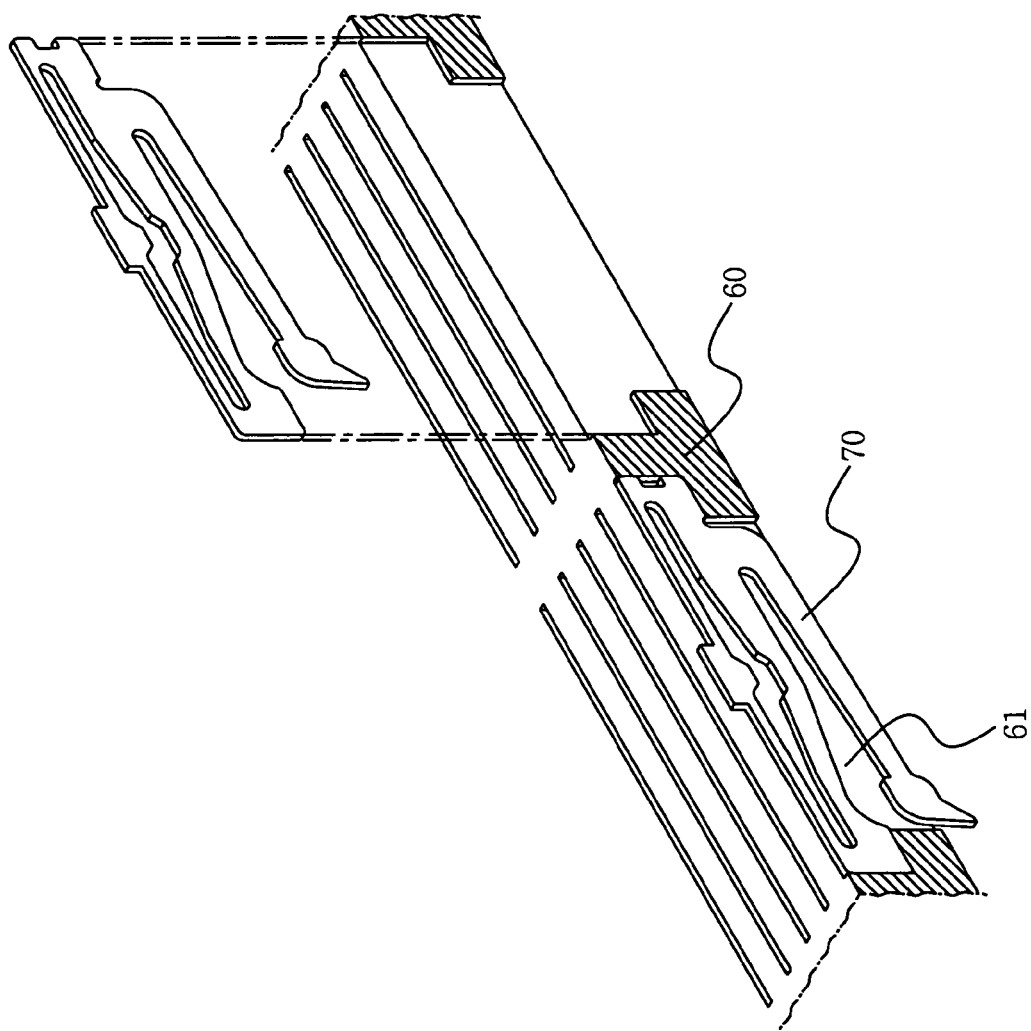
FIG. 4 is an exploded perspective view showing an assembly part of a needle guide member and a needle member according to the present invention.

The needle guide member 60 includes, as shown in FIG. 4, a number of needle insert holes 61 formed at intervals on a flat plate normally formed from a silicon material. The numerous needle insert holes 61 are formed simultaneously by fine silicon processing technology, particularly an etching process. The upper groove of each needle insert hole 61 is different in size from the lower groove.

The needle member 70 is inserted into each needle insert hole 61 of the needle guide member 60. A great number of needles are formed simultaneously on a fine thin plate by an etching process. The end of the needle member 70 has a connection area extended so as to be stably in face contact rather than point contact with the connection terminals of the sub board member 50.

Most preferably, the needle member 70 is formed from a Be—Cu material for the purpose of pattern workability.

The side cover member 80 has a stepped inner neck, which has a larger-diameter part with the sub board member 50 installed therein, and a smaller-diameter part with the needle guide member 60 inserted therein.

The side cover member 80 also has a stepped outer neck, which has a larger-diameter part to be inserted into the inner neck of the lower reinforcing plate 30, and a smaller-diameter part to slightly project downward from the flat side of the lower reinforcing member 30.

Particularly, the side cover member 80 is formed from a ceramic material highly resistant to external shock and distortion.

The clamping member 90 is a flat plate formed from an elastic metal material. The one end of the clamping member 90 is bolted to the lower reinforcing plate 30, and the other end of it elastically presses down the part of the side cover member 80 having a small outer diameter so as to hold the side cover member 80 together with the sub board member 50 and the interface member 40 firmly towards the main board member 10.

Figure 5:
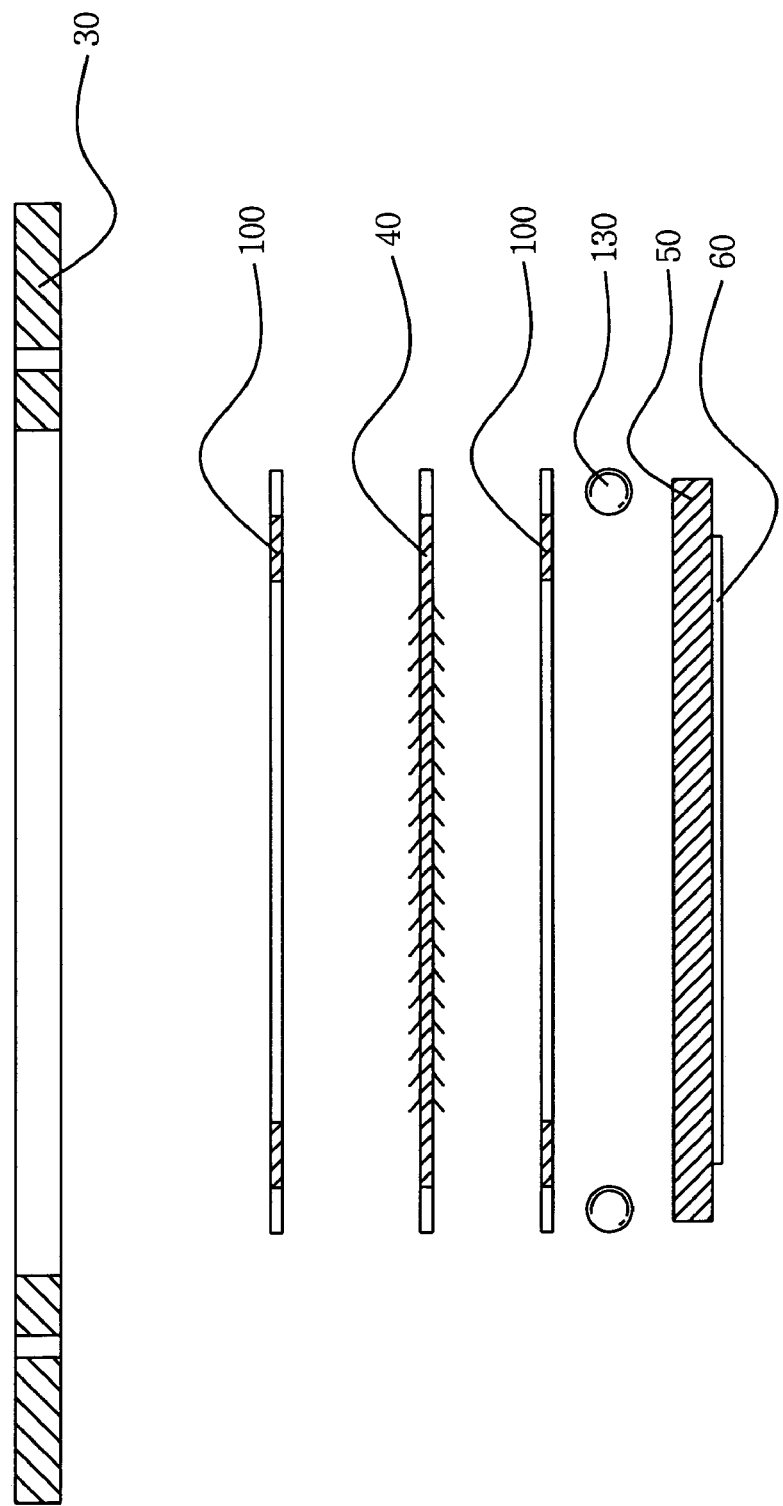
FIG. 5 is a partial enlarged side cross-section showing guide members provided on the top and bottom sides of the interface member in the probe card of the present invention.

Additionally, a guide member 100 may be provided, as shown in FIG. 5, between the main board member 10 and the interface member 40 and between the interface member 40 and the sub board member 50.

The guide member 100 is of a track-shaped structure having a thickness slightly smaller than the upward or downward extending height of the connection pins 44 on the interface member 40, with a central through hole having an allowable area to receive the connection pins 44.

The guide member 100 has such a thickness as not to excessively press down the connection pins 44 of the interface member 40 in contact with the circuit terminals of the main board member 10 and the sub board member 50. When the interface member 40 is excessively apart from the main board member 10 and the sub board member 50, the connection pins 44 are increasingly pressed down to make the connection ends of the connection pins 44 get out of the connection area of the circuit terminals, causing a connection failure.

Accordingly, it is most preferable that the thickness of the guide member 100 is slightly smaller than the extending height of the connection pins 44 so as not to excessively press down the connection ends of the connection pins 44 in contact with the circuit terminals.

The guide member 100 makes the guide projections 12 extending downward from the main board 10 be engaged with the interface member 40 for the prevention of the horizontal movement of the interface member 40.

In the present invention, the upper reinforcing plate 20 has a plurality of nut caps 110 equally spaced from the center and separated from one another at a same distance, the nut caps 110 piercing the flat plate of the upper reinforcing plate 20. The main board member 10 and the interface member 40 underlying the upper reinforcing plate 20 have through holes formed at positions vertically corresponding to the nut caps 110. Adjusting screws 120 are screwed in the nut caps 110 associated with the upper reinforcing plate 20, and balls 130 are formed on the top side of the sub board member 50 at positions vertically corresponding to the adjusting screws 120. When engaged with the upper reinforcing plate 20, the adjusting screws 120 presses down the balls 130 on the top side of the sub board member 50 by force so as to adjust the level of the sub board member 50.

Figure 6:
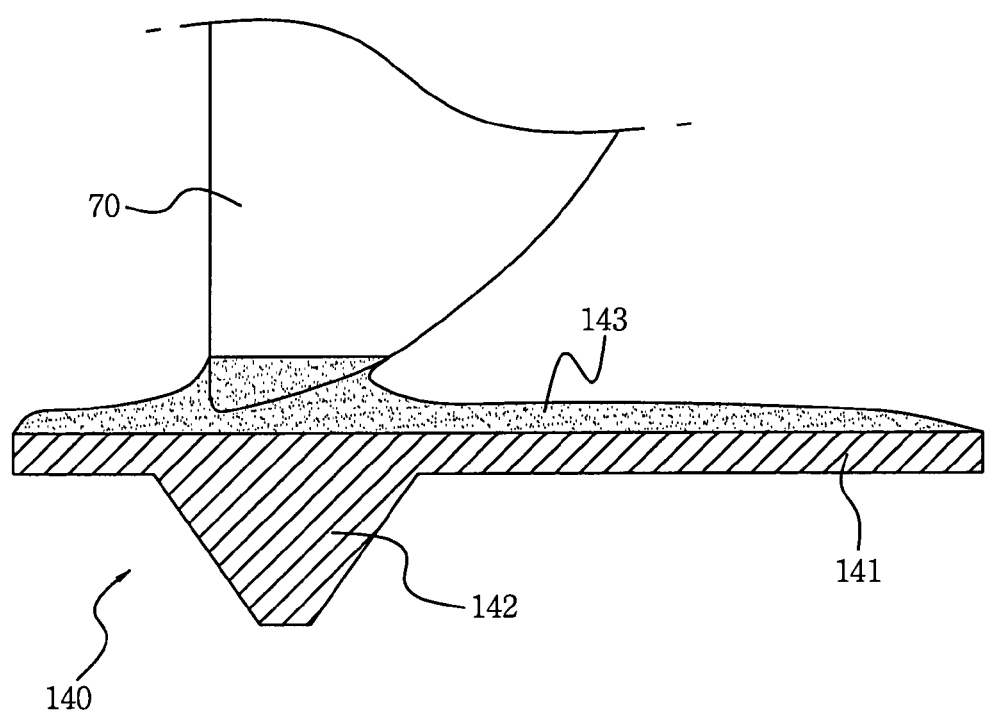
FIG. 6 is an enlarged cross-section showing a needle tip member associated with the needle member according to the present invention.

In the present invention, the lower end of the needle member 70 is associated with a needle tip member 140, as shown in FIG. 6.

The needle tip member 140 is separately fabricated by fine-pattern processing technology applied in the semiconductor fabrication process, such as etching and metal deposition, and integrally combined with the lower end of the needle member 70 by fusion welding.

The needle tip member 140 includes a base 141, a tip 142, and a joint 143. The base 141 is of a flat plate structure having a predetermined thickness.

The tip 142 is formed on the bottom side at the one end of the base 141. The tip 142 is formed in a polypyramidal or conical shape tapered from the side of the base 141. The bottom end of the tip 142 has a horizontal cut with a predetermined cross sectional area. Most preferably, the tip 142 is formed in a quadrangular pyramidal shape so as to maintain a defined connection area with the connection terminals.

The joint 143 is formed on the opposite side to the tip 142 in the base 141, i.e., extending upward with a predetermined height from the top side of the base 141. When combined with the needle member 70, the joint 143 is fused so that the needle member 70 can be integrally inserted into the joint 143.

Most preferably, the base 141 and the tip 142 of the needle tip member 140 are formed from a Ni—W alloy, and the joint 143 is formed from a Au—Sn alloy mainly used for welding in recent days.

The operation of the above-constructed present invention can be described as follows.

According to the present invention, the upper reinforcing plate 20 and the lower reinforcing plate 30 are attached to the top side and the bottom side of the main board member 10, respectively, and combined with the main board member 10 firmly by bolts.

The interface member 40, the sub board member 50, the needle guide member 60 and the guide member 100 are sequentially inserted into the lower reinforcing plate 30. With the side cover member 80 put on the lowermost end of the lower reinforcing plate 30, the lower reinforcing plate 30 is elastically fixed to the elastic clamping member 90.

Here, the needle members 70 formed in a fine thin plate shape is inserted into the respective needle insert holes 61 formed in the flat plate of the needle guide member 60.

At this assembly state, the upper reinforcing plate 20 has the adjusting screws 120 press down the balls 130 installed on the top side of the sub board member 50 with a predetermined pressure so as to adjust the level of the sub board member 50.

In accordance with the present invention, the sub board member 50 is formed from a ceramic material highly resistant to warping, with a circuit pattern formed in the ceramic material by thin film patterning technology, thereby providing a strong circuit board and hence guaranteeing an improved durability.

In addition, the interface member 40, the sub board member 50, the needle guide member 60 and the side cover member 80 are simply built up in sequence on the main board member 10 and then elastically fixed to the main board member with the clamping member 90. This guarantees the readiness of the assembly of the component parts and makes it easy to replace the component parts.

When there is an error or a defective detected during the characteristic testing using the present invention, the probe card can be disassembled into the respective component parts simply by separating the clamping member 90 to easily find out the reason of the defective and to separate a specific component part for the purpose of part replacement and repair.

The needle tip member 140 separately fabricated by a method of forming a fine pattern of semiconductor, such as etching and deposition technologies can be combined with the connection ends of the needle member 70.

The use of the needle tip member 140 solves the problem with the needle member 70 normally formed from a Be—Cu material in regard to fast abrasion and guarantees a stable connection.

It is actually true that the abrasion of the needle member 70 is inevitable, because the connection between the needle member 70 and a semiconductor device pattern is achieved through exposed areas of the semiconductor device pattern as the pattern is scratched out and removed of an oxide film by the sliding needle member 70.

Conventionally, the needle member 70, typically formed from a Be—Cu material, has a low abrasion resistance, so its friction with the semiconductor device pattern causes an abrasion to increase its connection area with the semiconductor device pattern and change the contact position. However, the present invention uses the needle tip member 140 associated with the connection ends of the needle member 70 to solve this problem.

In particular, the needle tip member 140 contributes to the minimization of the connection area, making it easier to cope with the fine pitches of the semiconductor device pattern having a design rule increasingly demanding higher fineness and maintaining a constant connection area with the pattern, to guarantee a precise and stable testing.

These advantages of the present invention in regard to testing and repair greatly reduce the general expense for the semiconductor process and particularly make it possible to appropriately cope with the semiconductor devices in increasing progress with higher integration and higher density.

As described above, the present invention achieves a flexible connection of an interface between the circuit boards through the elastic connection pins 52 to flexibly coping with a contact shock with the connection terminals of a semiconductor device and prevent damages on the boards, and combines the component parts together simply by face contacts to facilitate assembly and disassembly and provide convenience of maintenance and management.

In addition, the present invention maintains a face contact between the connection terminals of the needle member 70 and those of the semiconductor device and provides the needle tip member 140 to increase the contact strength, thereby guaranteeing a more stable connection with the semiconductor device.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A probe card for testing semiconductor devices, comprising a main board member having connection terminals formed on a top side thereof to be in contact with pogo pins of a test head, and connection terminals concentrated on the center of a bottom side thereof to be in contact with the connection terminals of the top side, thereby forming a connection circuit;

an upper reinforcing plate fixedly engaged with the center of the top side of the main board member so as to prevent an upward distortion of the main board member;

a lower reinforcing plate formed in a track-shaped structure having a predetermined thickness and a predetermined width on the center of the main board member, and fixedly engaged with the main board member together with the upper reinforcing plate so as to prevent a downward distortion of the main board member;

an interface member having connection terminals formed on the top and bottom sides thereof on a same vertical line to be in contact with each other, each connection terminal being combined with the one end of a connection pin at a predetermined angle in the mutually corresponding directions to have elasticity, the other end of the connection pin on the top side being in contact with the connection circuit of the main board member, the interface member being inserted in an inner space of the lower reinforcing plate so as to prevent its horizontal movement;

a sub board member being formed from a ceramic material and having a circuit pattern formed by a fine-pattern forming process of semiconductor, the circuit pattern having connection terminals formed on a top side thereof to be in contact with the connection pins slantly extending downward from the interface member, and connection terminals formed on a bottom side thereof to form an integrated circuit pattern smaller in size than the circuit pattern of the top side;

a needle guide member having a flat plate provided with a plurality of needle insert holes formed on the same vertical line of the connection terminals on the bottom side of the sub board, and being attached to the bottom side of the sub board member;

a plurality of needle members having a patterned fine thin plate inserted into the respective needle insert holes of the needle guide member;

a side cover member being inserted into the lower reinforcing plate and having a stepped inner neck with the sub board member and the needle guide member combined together and fixedly inserted therein; and a clamping member having the one end thereof being bolted to the lower reinforcing plate and the other end thereof being formed from a thin plate of an elastic metal material so as to press upwardly a stepped outer neck of the side cover member.

2. The probe card for testing semiconductor devices as claimed in claim 1, wherein the upper reinforcing plate and the lower reinforcing plate are formed from a SUS material.

3. The probe card for testing semiconductor devices as claimed in claim 1, wherein the interface member has conductive connection pins formed on a non-conductive board.

4. The probe card for testing semiconductor devices as claimed in claim 1, wherein the sub board member is combined with the needle guide member by an adhesive.

5. The probe card for testing semiconductor devices as claimed in claim 1, wherein the needle guide member has the needle insert holes formed by an etching process.

6. The probe card for testing semiconductor devices as claimed in claim 1, wherein the needle members is are formed by etching a fine thin plate.

7. The probe card for testing semiconductor devices as claimed in claim 1, wherein the side cover member is formed from a ceramic material.

8. The probe card for testing semiconductor devices as claimed in claim 1, further comprising:

guide members formed in the form of a thin plate having a predetermined thickness and provided on the main board member and the sub board member, respectively, with the interface member interposed between the main board member and the sub board member.

9. The probe card for testing semiconductor devices as claimed in claim 8, wherein the guide members are formed in a track-shaped structure having a through hole of a predetermined area formed therein so as to expose the circuit patterns formed on the top and bottom sides of the interface member.

10. The probe card for testing semiconductor devices as claimed in claim 8, wherein the guide members have guide projections of the main board member inserted therein so as to prevent a horizontal movement.

11. The probe card for testing semiconductor devices as claimed in claim 1, wherein the upper reinforcing plate has a plurality of nut caps equally spaced from the center thereof and separated from one another at a same distance, the nut caps being engaged with adjusting screws to have the adjusting screws vertically piercing the flat plates of the main board member, the guide member and the interface member and to press down balls formed on the top side of the sub board member by a defined force, thereby adjusting the level of the sub board member by the engagement of the adjusting screws.

12. The probe card for testing semiconductor devices as claimed in claim 1, further comprising:

a needle tip member being formed by a fine-pattern processing technology used in a semiconductor fabrication process and integrally associated by fusion welding with a connection end of the bottom end of the needle members in contact with the connection terminals of a semiconductor device.

13. The probe card for testing semiconductor devices as claimed in claim 12, wherein the needle tip member includes:

a base being a flat plate having a predetermined thickness;

a tip formed on the bottom side of the needle tip member at the one end of the base, the tip being formed in a polypyramidal or conical shape tapered downward from the side of the base, the tip having a bottom end thereof horizontally cut in a predetermined cross sectional area, the bottom end of the tip having a predetermined connection area in contact with the connection terminals of the semiconductor device; and a joint projecting upward in a predetermined height from the top side of the needle tip member on the opposite side of the tip and associated with the connection end of the needle members by fusion welding.

14. The probe card for testing semiconductor devices as claimed in claim 12, wherein the needle tip member is formed from a Ni—W material.

* * * * *